US 8,288,257 B2

(12) United States Patent
Scotney-Castle et al.

(10) Patent No.: US 8,288,257 B2
(45) Date of Patent: Oct. 16, 2012

(54) DOPING PROFILE MODIFICATION IN P3I PROCESS

(75) Inventors: Matthew D. Scotney-Castle, Morgan Hill, CA (US); Majeed A. Foad, Sunnyvale, CA (US); Peter I. Porshnev, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 486 days.

(21) Appl. No.: 12/606,897

(22) Filed: Oct. 27, 2009

(65) Prior Publication Data
US 2010/0112794 A1 May 6, 2010

Related U.S. Application Data

(60) Provisional application No. 61/110,478, filed on Oct. 31, 2008.

(51) Int. Cl.
*H01L 21/425* (2006.01)
(52) U.S. Cl. ........ 438/528; 438/514; 438/515; 438/520; 438/527
(58) Field of Classification Search .................. 438/514, 438/515, 520, 527–528
See application file for complete search history.

(56) References Cited

U.S. PATENT DOCUMENTS

| 6,165,876 | A | 12/2000 | Yamazaki et al. |
| 2004/0107906 | A1 | 6/2004 | Collins et al. |
| 2008/0108208 | A1* | 5/2008 | Arevalo et al. ............... 438/514 |
| 2008/0153271 | A1 | 6/2008 | Foad et al. |
| 2008/0160728 | A1* | 7/2008 | Sasaki et al. ................. 438/511 |
| 2008/0290425 | A1* | 11/2008 | Giles et al. ................... 257/408 |
| 2009/0227096 | A1* | 9/2009 | Godet et al. ................. 438/527 |

OTHER PUBLICATIONS

Chu, et al.; Semiconductor Applications, Handbook of Plasma Immersion Ion Implantation and Deposition, A. Anders ed., 2000, New York, John Wiley & Sons, pp. 637-681.
International Search Report and Written Opinion of the International Searching Authority mailed Dec. 22, 2009, in International Application No. PCT/US 09/62237.

* cited by examiner

*Primary Examiner* — Bac Au
(74) *Attorney, Agent, or Firm* — Patterson & Sheridan, LLP

(57) ABSTRACT

Methods for implanting material into a substrate by a plasma immersion ion implanting process are provided. In one embodiment, a method for implanting material into a substrate includes providing a substrate into a processing chamber, the substrate comprising a substrate surface having a material layer formed thereon, generating a first plasma of a non-dopant processing gas, exposing the material layer to the plasma of the non-dopant processing gas, generating a second plasma of a dopant processing gas including a reacting gas adapted to produce dopant ions, and implanting dopant ions from the plasma into the material layer. The method may further include a cleaning or etch process.

20 Claims, 3 Drawing Sheets

DOPING PROFILE MODIFICATION IN P3I PROCESS

CROSS-REFERENCE TO RELATED APPLICATIONS

This application claims benefit of U.S. provisional patent application Ser. No. 61/110,478, filed Oct. 31, 2008, which is herein incorporated by reference.

BACKGROUND OF THE INVENTION

1. Field of the Invention

Embodiments of the invention generally relate to the field of semiconductor manufacturing processes and devices, more particular, to methods of implanting ions into a substrate by a plasma immersion ion implantation process.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor substrate) and cooperate to perform various functions within the circuit. A CMOS transistor comprises a gate structure disposed between source and drain regions that are formed in the substrate. The gate structure generally comprises a gate electrode and a gate dielectric layer. The gate electrode is disposed over the gate dielectric layer to control a flow of charge carriers in a channel region formed between the drain and source regions beneath the gate dielectric layer.

An ion implantation process is typically utilized to implant, or dope, ions, also called dopants, into the substrate, forming the gate and source drain structure with desired profile and concentration on the substrate. During an ion implantation process, different process gases or gas mixtures may be used to provide ion source species. As the process gases are supplied into the ion implantation processing chamber (such as a P3i™ processing chamber commercially available from Applied Materials, Inc., of Santa Clara, Calif.), a RF power may be generated to produce a plasma to promote ion dissociation in the process gases and accelerate the dissociated ions toward and into the surface of the substrate. The deposited ion profile often results in a peak dopant concentration below the surface. With the advent of smaller features and reduced device sizes, the dopant profile is required to have sufficient concentration of dopants in shallow depths than previously required and reduced concentrations at further depths. Current implantation processes do not produce suitable concentrations of dopants at shallower depths.

Therefore, there is a need for an improved ion implantation process for producing dopant concentrations at depths suitable for semiconductor devices with reduced device sizes.

SUMMARY OF THE INVENTION

Methods for implanting material into a substrate by a plasma immersion ion implantation process having a balanced etch-deposition process are provided. In one embodiment, a method for implanting materials into a substrate includes providing a substrate to a processing chamber, the substrate comprising a substrate surface having a material layer formed thereon, generating a first plasma of a non-dopant processing gas, exposing the material layer to the plasma of the non-dopant processing gas, generating a second plasma of a dopant processing gas including a reacting gas adapted to produce dopant ions, and implanting dopant ions from the plasma into the material layer. A cleaning etching process may also be performed.

In another embodiment, a method for implanting ions into a substrate includes providing a substrate to a processing chamber, the substrate comprising a substrate surface having a material layer formed thereon, generating a first plasma of a dopant processing gas including a reacting gas adapted to produce dopant ions, implanting dopant ions from the plasma into the material layer, generating a second plasma of a non-dopant processing gas, and exposing the material layer to the plasma of the non-dopant processing gas. A cleaning etching process may also be performed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention provide methods for implanting dopants into a substrate by a plasma immersion ion implantation process. The invention may be used in gate structure or source/drain region formation including, but not limited to, poly doping, counter-poly doping, ultra shallow junction, and conformal doping for structures formed on a substrate, among others. The ion implantation process may be utilized in different applications, such as DRAM, logic products, and flash memory.

In one embodiment, the ion implantation process is performed by supplying a gas mixture including a reacting gas, for example a boron-containing gas. A plasma is generated to dissociate ions from the gas mixture, such as a dopant processing gas, thereby forming a source of ions that are accelerated toward and implanted into a material layer formed on an electrically biased substrate. The implanted ions may also be referred to as dopants. Prior to or after ion implantation, the surface of the material layer may be treated with a plasma process. The plasma process may use a non-dopant processing gas, such as an inert gas or hydrogen. A cleaning etching process may also be performed. Following the implantation process or the implantation/plasma treatment process combination.

Figure 1A:
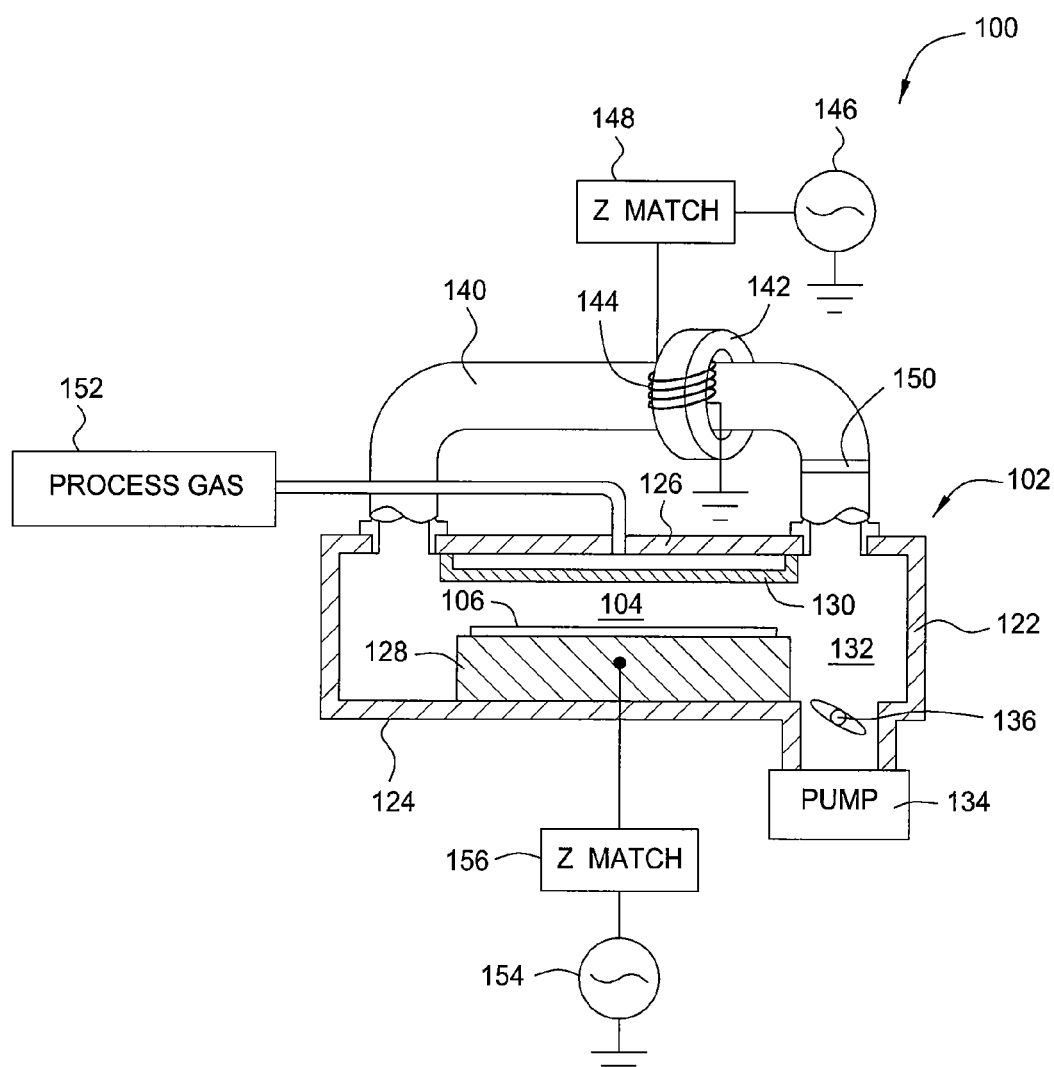
FIGS. 1A-1B depict one embodiment of a plasma immersion ion implantation tool suitable for practicing the present invention.

FIG. 1A depicts a processing chamber 100 that may be utilized to practice an ion implantation process according to one embodiment of the invention. One suitable reactor chamber which the process may be practiced is a P3i® reactor chamber, available from Applied Materials, Inc., of Santa Clara, Calif. It is contemplated that the methods described herein may be practiced in other suitably adapted processing chambers, including those from other manufacturers. Other suitable reactor chambers include the chambers described in U.S. Pat. No. 7,094,670, issued on Aug. 22, 2006, and U.S. Pat. No. 6,494,986, issued on Dec. 17, 2002, both of which are hereby incorporated by reference to the extent not inconsistent with the recited claims and description herein.

The processing chamber 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A process gas source 152 is coupled to the gas distribution plate 130 to supply gaseous precursor compounds for processes performed on the substrate 106.

Figure 1B:
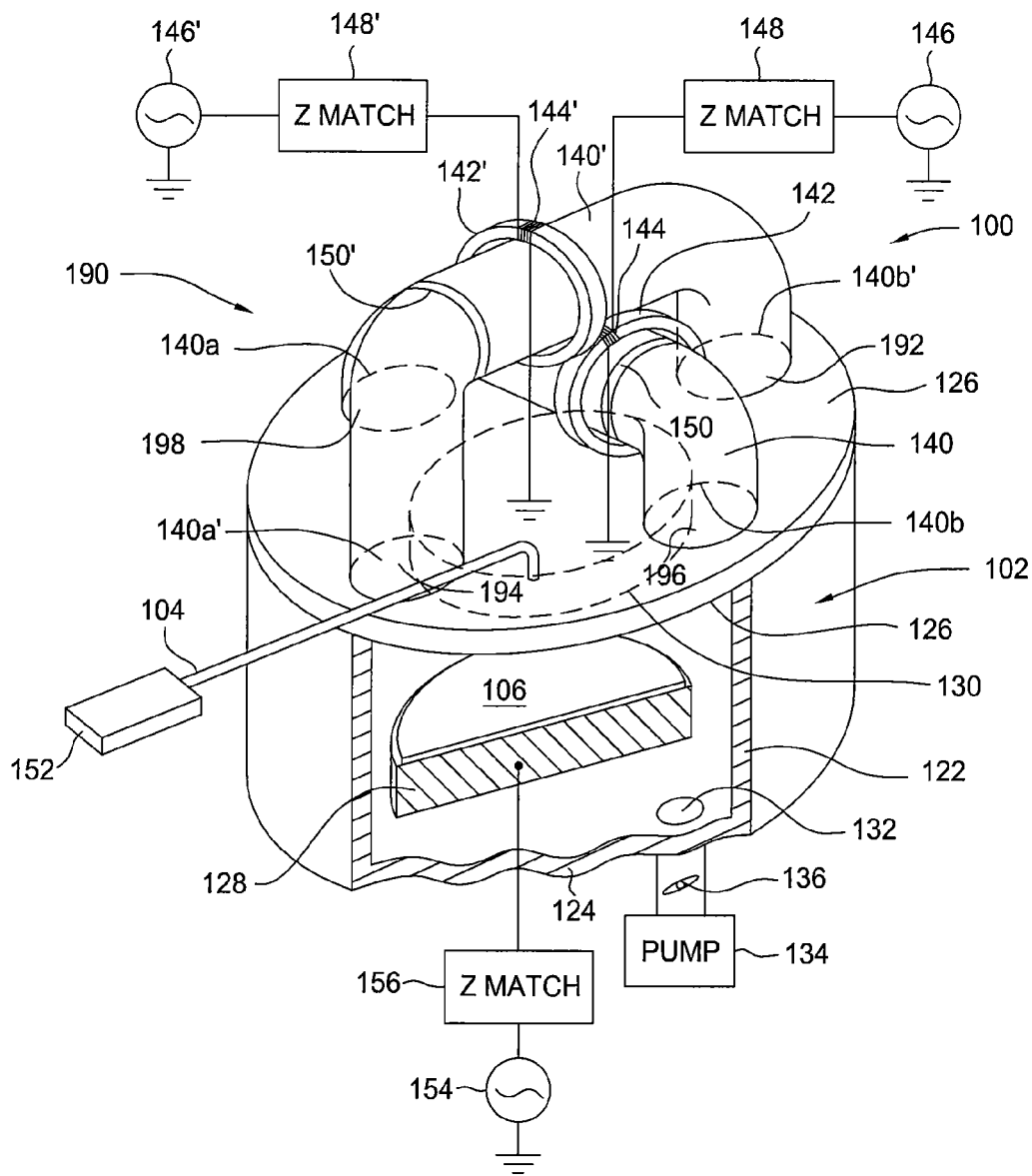

The chamber 100 depicted in FIG. 1A further includes a plasma source 190 best shown in the perspective view of FIG. 1B. The plasma source 190 includes a pair of separate external reentrant conduits 140, 140' mounted on the outside of the top 126 of the chamber body 102 disposed transverse to one another (or orthogonal to one another as the exemplary embodiment depicted in FIG. 1B). The first external conduit 140 has a first end 140a coupled through an opening 198 formed in the top 126 into a first side of the process region 104 in the chamber body 102. A second end 140b has an opening 196 coupled into a second side of the process region 104. The second external reentrant conduit 140' has a first end 140a' having an opening 194 coupled into a third side of the process region 104 and a second end 140b' having an opening 192 into a fourth side of the process region 104. In one embodiment, the first and second external reentrant conduits 140, 140' are configured to be orthogonal to one another, thereby providing the two ends 140a, 140a', 140b, 140b' of each external reentrant conduits 140, 140' disposed at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may have other configurations utilized to control plasma distribution in the process region 104.

Magnetically permeable torroidal cores 142, 142' surround a portion of a corresponding one of the external reentrant conduits 140, 140'. The conductive coils 144, 144' are coupled to respective RF plasma source power generators 146, 146' through respective impedance match circuits or elements 148, 148'. Each external reentrant conduits 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF plasma bias power generator 154 coupled to the substrate support assembly 128 through an impedance match circuit or element 156.

Referring back to FIG. 1A, process gases including gaseous compounds supplied from the process gas source 152 are introduced through the overhead gas distribution plate 130 into the process region 104. RF plasma source power generator 146 is coupled from the power applicators, i.e., core and coil, 142, 144 to gases supplied in the conduit 140, which creates a circulating plasma current in a first closed torroidal path including the external reentrant conduit 140 and the process region 104. Also, RF plasma source power generator 146' may be coupled from the other power applicators, i.e., core and coil, 142', 144' to gases in the second conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF plasma source power generators 146, 146', which may be the same or slightly offset from one another.

In one embodiment, the process gas source 152 provides different process gases to the processing chamber including pre-treatment and post-treatment gases, etching or cleaning gases, and gases that may be utilized to provide ions implanted to the substrate 106. Process gases for pre-treatment and post-treatment gases include inert gases, hydrogen gas, and combinations thereof, may be supplied from the gas source. Suitable inert gases include helium, argon, and combinations thereof. Suitable examples of process gases for implanting ions for p-type and n-type materials include diborane ($B_2H_6$), arsine ($AsH_3$), $PH_3$, $PF_3$, $BF_3$, $P_2H_5$, GaN, $AsF_5$ and combinations thereof.

The power of each RF plasma source power generators 146, 146' is operated so that their combined effect efficiently dissociates the process gases supplied from the process gas source 152 and produces a desired ion flux at the surface of the substrate 106. The power of the RF plasma bias power generator 154 is controlled at a selected level at which the ion energy dissociated from the process gases may be accelerated toward the substrate surface and implanted at a desired depth below the top surface of the substrate 106 in a desired ion concentration. For example, with relatively low RF power, such as less than about 50 eV, relatively low plasma ion energy may be obtained. Dissociated ions with low ion energy may be implanted at a shallow depth between about 1 Å and about 100 Å from the substrate surface. Alternatively, dissociated ions with high ion energy provided and generated from high RF power, such as higher than about 50 eV, may be implanted into the substrate having a depth substantially over 100 Å depth from the substrate surface.

The combination of the controlled RF plasma source power and RF plasma bias power dissociates ion in the gas mixture having sufficient momentum and desired ion distribution in the processing chamber 100. The ions are biased and driven toward the substrate surface, thereby implanting ions into the substrate in a desired ion concentration, distribution and depth from the substrate surface. Furthermore, the controlled ion energy and different types of ion species from the supplied process gases allow ions to be implanted in the substrate 106 to form desired device structures, such as gate structure and source drain region on the substrate 106.

A method for treating a material layer formed on a substrate and implanting ions therein by a plasma immersion ion implantation process is described as follows. The method may be performed in a plasma immersion ion implantation processing chamber, such as the processing chamber 100, as described in FIG. 1A-1B herein, or other suitably adapted chamber. The method may be performed in situ entirely in one processing chamber, or in a tool comprising a plurality of processing chambers, in situ without breaking vacuum.

The method begins by providing a substrate in the processing chamber. In one embodiment, the substrate may be a material such as silicon oxide, silicon carbide, crystalline silicon (e.g., Si<100> or Si<111>), strained silicon, silicon germanium, doped or undoped polysilicon, doped or undoped silicon substrates, doped silicon, germanium, gallium arsenide, gallium nitride, glass, and sapphire. The substrate may have various dimensions, such as 200 mm or 300 mm diameter substrates, as well as, rectangular or square panes. Unless otherwise noted, embodiments and examples described herein are conducted on substrates with a 300 mm diameter. In embodiments where the substrate is utilized to form a gate structure, a polysilicon layer may be disposed on a gate dielectric layer on the substrate. Substrate feature, such as trenches, vias, distinct layer stacks may be formed on the substrate surface. Additional, one or more materials may be deposited on the substrate surface, for example, a n-type material or p-type material.

In one embodiment of an ion implantation process, a gas mixture is supplied into the processing chamber that may provide a material for deposition and/or provide ion species for an implantation process. The gas mixture may be supplied from the process gas source 152 to the gas distribution plate 130, as described in FIG. 1A, or by other suitable means.

In one embodiment, the gas mixture supplied into the processing chamber 100 includes a reacting gas. The reacting gas may provide a dopant material for implantation in a substrate surface used to form active dopants in the electric device to produce desired electrical performance and/or physical properties of the doped region of the substrate. The dopant material may include boron, arsenic, phosphorus, gallium, or combinations thereof. In one embodiment, the reacting gases that may be used to provide an ion specie source include diborane ($B_2H_6$), arsine ($AsH_3$), $PH_3$, $PF_3$, $BF_3$, $P_2H_6$, GaN, $AsF_5$ and combinations thereof. For example, in embodiments where the reacting gas is $B_2H_6$ gas, the $B_2H_6$ gas may be dissociated during the implantation process to produce ion species in form of $B_2H_5^+$, $BH_2^+$ and $H^+$ ions.

In another embodiment, the gas mixture supplied into the processing chamber may include an inert gas. Examples of suitable inert gases include $N_2$, Ar, He, Xe, and Kr and the like. The inert gas in the processing chamber promotes the ion bombardment in the gas mixture, thereby efficiently increasing the probability of process gas collision, resulting in reduced recombination of ion species. The inert gas may be flowed in to the processing chamber at a rate between about 10 sccm and about 2,000 sccm, such as between about 50 sccm and about 500 sccm.

A RF source power is applied to generate a plasma of the gas mixture in the processing chamber. The plasma is continuously generated to dissociate the gas mixture as ion species and implant into the substrate. A RF bias power may be applied along with the RF source power to dissociate and drive the dissociated the ion species from the gas mixture toward and into a desired depth from the substrate surface. The RF source and bias power applied to the processing chamber may be controlled at a desired energy level, thereby allowing the gas precursors to be ionized and dissociated to dope with a desired concentration and depth in the substrate. In one embodiment of the process described above, the ions, also known as dopants, may be deposited to a depth of less than 100 Å at a dose in a range from about $10^{15}$ to about $10^{17}$ atoms/cm$^2$, and a dose in a range from about $10^{14}$ to about $10^{16}$ atoms/cm$^2$ at a depth of about 500 Å.

In one embodiment, the source RF power may be maintained at between about 100 Watts and about 5,000 Watts. The bias RF power may be maintained at between about 100 Watts and about 10,000 Watts at a RF voltage between about 100 Volts and about 15,000 Volts.

Several process parameters may also be regulated during the plasma immersion ion implantation process. In one embodiment, the chamber pressure may be maintained at between about 1 mTorr and about 500 mTorr. The substrate temperature may be maintained at between about 10 degrees Celsius and about 500 degrees Celsius.

The amount of dopants in a layer may be defined as a concentration or a dosage. A concentration of dopants is represented by atoms of dopant per unit volume, atoms/cm$^3$. The dosage/dose of the dopants is represented by atoms of dopant per unit area, atoms/cm$^2$.

One embodiment of an implantation process includes providing a reacting gas, such as diborane ($B_2H_6$) or arsine ($AsH_3$), into the processing chamber at a flow rate from about 10 to about 1,000 sccm, such as from about 10 sccm to about 100 sccm, applying a bias at a voltage from about 200 to about 10,000 volts (V), such as from about 500 V to about 2,000 V, maintaining a chamber pressure from about 1 mTorr to about 100 mTorr, such as from about 7 mTorr to about 15 mTorr, maintaining a substrate support temperature from about 15° C. to about 500° C., such as from about 25° C. to about 45° C., with an implantation process at a source power from about 100 W to about 2,000 W, such as from about 200 W to about 300 W, at a duration from about 1 second to about 60 seconds, such as from about 10 seconds to about 30 seconds.

An example of such a process includes providing diborane ($B_2H_6$) into the processing chamber at a flow rate of about 50 sccm, applying a bias at a voltage of about 1,000 V or 1,500 V, maintaining a chamber pressure of about 15 mTorr, maintaining a substrate support temperature of about 25° C., with an implantation process at a source power of about 200 W, at a duration of about 15 or 20 seconds.

Prior to and/or following the implantation process, the material layer may be plasma treated. The pre-implantation plasma treatment, plasma pre-treatment, and the post-implantation plasma treatment, plasma post-treatment, may be performed in situ, in the same chamber or tool without breaking vacuum.

Suitable plasma processing gases include non-dopant gases, such as inert gases, hydrogen gas ($H_2$), or combinations thereof. A non-dopant gas is broadly defined herein as a gas that does not impart a p-type or n-type material in a substrate surface after implantation. Examples of suitable inert gases are noble gases including argon (Ar), helium (He), and combinations thereof. Non-dopant gases are broadly defined as herein as gas that does not provide ions (dopants) for implantation to form n-type or p-type materials in a material layer.

One embodiment of a plasma process includes an inert gas, such as helium, into the processing chamber at a flow rate from about 25 to about 1,000 sccm, such as from about 100 to about 200 sccm, maintaining a chamber pressure from about 1 mTorr to about 100 mTorr, such as from about 7 mTorr to about 15 mTorr, maintaining a substrate support temperature from about 15° C. to about 500° C., such as from about 25° C. to about 45° C., applying a source power to a plasma source from about 100 W to about 2,000 W, such as from about 200 W to about 300 W, applying a bias the substrate support from about 200 volts (V) to about 7,000 V, such as from about 500 V to about 1,600 V, for a period of time from about 3 seconds to about 50 seconds, such as from about 15 seconds to about 30 seconds.

Figure 2:
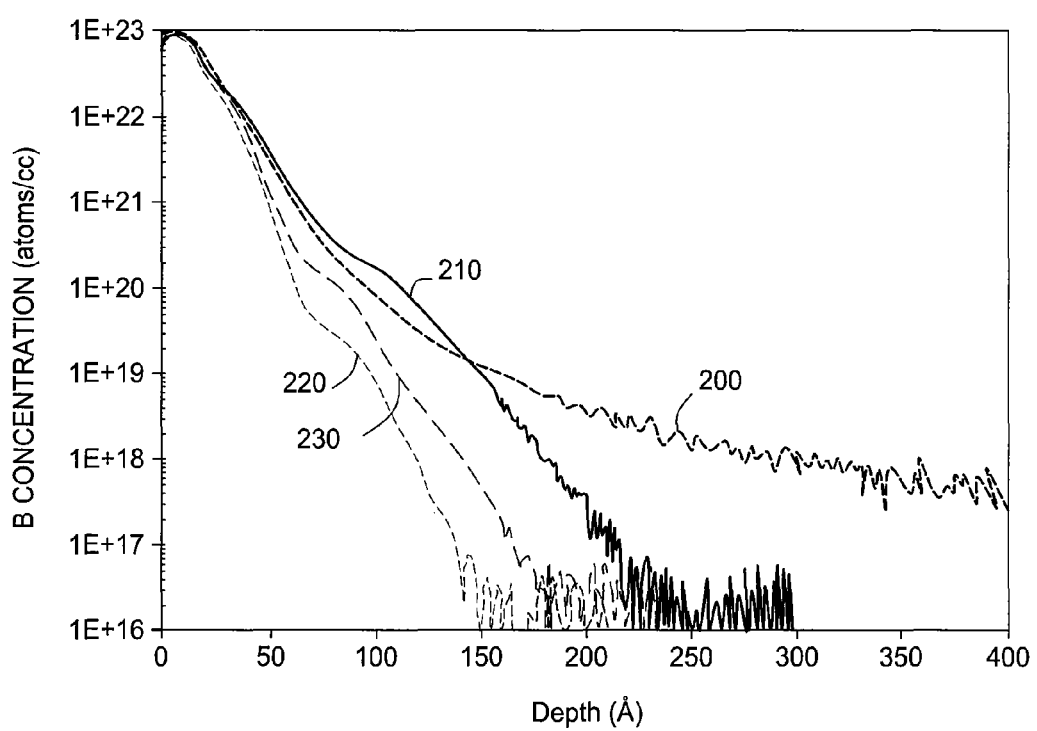
FIG. 2 is a chart showing the boron concentration in atoms/$cm^3$ to the depth of the material being implanted.

FIG. 2 is a chart showing the boron concentration in atoms/cm$^3$ versus the depth of the material being implanted for four exemplary substrates. Three of the substrates were processed by first plasma treating the surface of each substrate and then in situ implanting dopant ions into the treated surface material. One substrate was implanted without pre-treatment. The dopant content of the deposited film was analyzed to have a concentration of between about $10^{23}$ atoms/cm$^3$ (also represented as $1E^{23}$ atoms/cm$^3$ as illustrated in FIG. 2) at a depth of about 1 Å and about $10^{17}$ atoms/cm$^3$ at a depth of up to about 250 Å and a concentration from about $10^{14}$ atoms/cm$^3$ to about $10^{16}$ atoms/cm$^3$ at a depth of about 500 Å compared to $10^{18}$ atoms/cm$^3$ at a depth of about 300 Å or greater for a process without the plasma pre-implantation process. The doping profile of each exemplary substrate is shown in FIG. 2.

In a first example of a pre-treatment process, helium is provided to the processing chamber at a flow rate of about 100 sccm, maintaining a chamber pressure of about 15 mTorr, maintaining a chamber temperature of about 25° C., applying a source power of about 200 W, and applying a bias power of about 1,600 V, for about 30 seconds. The helium content in the implanted layer was analyzed to have a concentration of between about $10^{17}$ atoms/cm$^3$ and about $10^{22}$ atoms/cm$^3$ at a depth of surface up to about 250 Å. The helium content in the implanted layer was also observed to have a concentration of between about $10^{19}$ atoms/cm$^3$ and about $10^{22}$ atoms/cm$^3$ at a depth of about 150 Å. The helium concentration was discovered to have a similar concentration to the dopant concentration from about ½ to ⅓ of the depth of the deposited dopant material. The pre-treatment process may also be performed after implantation as a post-treatment process. Additionally, repeating cycles of pre-treatment and implantation may be performed to provide the desired concentration of the dopants in the material layer.

The pre-treatment process described above was immediately followed by an implantation process comprising providing diborane (B$_2$H$_6$) into the processing chamber at a flow rate of about 50 sccm, applying a bias at a voltage of about 1,200 V, maintaining a chamber pressure of about 15 mTorr, maintaining a wafer chuck temperature of about 25° C., and providing source power of about 200 W, at a duration of about 20 seconds. The plasma treatment process and ion implantation process produces a concentration of dopants at a surface depth of about $10^{23}$ atoms/cm$^3$ to about $10^{17}$ atoms/cm$^3$ at a depth of about 225 Å.

In a second example of such a process, helium is provided into the processing chamber at a flow rate of about 100 sccm, maintaining a chamber pressure of about 15 mTorr, maintaining a chamber temperature of about 25° C., applying a source power of about 200 W, and applying a bias power of about 500 V, for about 30 seconds.

The pre-treatment process was immediately followed by an implantation process comprising providing diborane (B$_2$H$_6$) into the processing chamber at a flow rate of about 50 sccm, applying a bias at a voltage of about 1,200 V, maintaining a chamber pressure of about 15 mTorr, maintaining a wafer chuck temperature of about 25° C., and providing source power of about 200 W, at a duration of about 20 seconds. The plasma treatment process and ion implantation process produces a concentration of dopants at a surface depth of about $10^{23}$ atoms/cm$^3$ to about $10^{17}$ atoms/cm$^3$ at a depth of about 150 Å.

In a third example of such a process, helium is provided into the processing chamber at a flow rate of about 100 sccm, maintaining a chamber pressure of about 15 mTorr, maintaining a chamber temperature of about 25° C., applying a source power of about 200 W, and applying a bias power of about 500 V, for about 15 seconds.

The pre-treatment process was immediately followed by an implantation process comprising providing diborane (B$_2$H$_6$) into the processing chamber at a flow rate of about 50 sccm, applying a bias at a voltage of about 1,200 V, maintaining a chamber pressure of about 15 mTorr, maintaining a wafer chuck temperature of about 25° C., and providing a source power of about 200 W, at a duration of about 20 seconds. The plasma treatment process and ion implantation process produces a concentration of dopants at a surface depth of about $10^{23}$ atoms/cm$^3$ to about $10^{17}$ atoms/cm$^3$ at a depth of about 180 Å.

For a comparison example, a boron dopant was implanted by a process providing diborane (B$_2$H$_6$) into the processing chamber at a flow rate of about 50 sccm, applying a bias at a voltage of about 1,200 V, maintaining a chamber pressure of about 15 mTorr, maintaining a wafer chuck temperature of about 25° C., and providing a source power of about 200 W, at a duration of about 20 seconds with a dopant concentration of $10^{18}$ atoms/cm$^3$ at a depth of about 300 Å.

FIG. 2 shows the boron concentration in atoms/cm$^3$ to the depth of the material being implanted for the processes described above. As shown in FIG. 2, the untreated substrate surface having a boron implantation process as described for comparison example 200 indicates a concentration of $10^{18}$ atoms/cm$^3$ at a depth of about 300 Å. The dopant concentration of the first example 210 indicates a concentration of $10^{18}$ atoms/cm$^3$ at a depth of about 180 Å and a concentration of $10^{17}$ atoms/cm$^3$ at a depth of about 225 Å. The dopant concentration of the second example 220 indicates a concentration of $10^{18}$ atoms/cm$^3$ at a depth of about 120 Å and a concentration of $10^{17}$ atoms/cm$^3$ at a depth of about 150 Å. The dopant concentration of the third example 230 indicates a concentration of $10^{18}$ atoms/cm$^3$ at a depth of about 140 Å and a concentration of $10^{17}$ atoms/cm$^3$ at a depth of about 180 Å.

The plasma treatment process and the ion implantation process described herein is observed to produce a dopant concentration from about $10^{17}$ atoms/cm$^3$ to about $10^{18}$ atoms/cm$^3$ at a depth between about 120 Å and about 250 Å.

Thus, FIG. 2 illustrates that a plasma treatment prior to the ion implantation process can allow for increasing concentrations at shallower depths, thereby, limiting the dopant concentration to depths less than about 250 Å, shallower depth, than possible by prior process which exhibit high dopant concentrations at depth of 400 Å or greater. It is believed that the pre-treatment process and ion implantation process described herein provides for decreasing a dopant profile abruptness from 3 nanometers/decade (nm/dec) to 5 nm/dec in prior processes to about 1 nm/dec to 2 nm/dec for the processes described herein at the slope of the profile at between $10^{18}$ and $10^{19}$ atoms/cm$^3$.

An optional cleaning/etching process may be performed in a processing chamber prior to or following the implantation process and/or the implantation and plasma treatment process described herein. The cleaning process may be performed in cycles with the implantation process and/or the implantation and plasma treatment process described herein from 1 to 20 cycles.

Suitable cleaning/etching process gases including gaseous compounds supplied from the process gas source may include oxygen-containing or fluorine containing gases, such as O$_2$, C$_2$F$_5$H, F$_2$, NF$_3$, CF$_4$, C$_3$F$_8$, or SF$_6$, and combinations thereof, and optionally, carrier gases, such as helium and argon. The process is etching if the substrate is in the processing chamber and is a chamber clean process if there is no substrate in the processing chamber. The cleaning/etching process may be performed in situ with the implantation process and/or the plasma treatment process.

It is believed that some of the implant processes can have a concurrent deposition in addition to doping, such as for hydrides based processes, for example, for the case of B$_2$H$_6$, AsH$_3$, and PH$_3$. The deposited layer can interfere with the deposition process, and it is preferable to control this layer growth. To achieve this goal the implant process can be interrupted and a short etching/cleaning step can be run to remove the deposited layer. Then the implant process can be resumed to achieve the target dose.

One suitable cleaning process includes providing a cleaning gas, such as nitrogen trifluoride (NF$_3$), into the processing chamber at a flow rate from about 25 to about 1,000 sccm, such as from about 50 to about 1,000 sccm, for example, about 100, providing an inert gas, such as argon, into the processing chamber at a flow rate from about 50 to about 1,000 sccm, such as from about 100 sccm to about 200 sccm, for example, about 1,500 sccm, applying a source power at a power level from about 100 W to about 2,000 W, such as from about 100 W to about 300 W, for example, about 200 W, maintaining a chamber pressure from about 1 mTorr to about 100 mTorr, such as from about 5 mTorr to about 30 mTorr, for example, about 10 mTorr, maintaining a chamber temperature from about 20° C. to about 500° C., such as from about 25° C. to about 45° C., for example, at a duration from about 3 seconds to about 30 seconds, such as from about 5 seconds to about 15 seconds, for example, about 10 seconds.

Thus, methods for implanting ions into a substrate by a plasma immersion ion implanting process are provided. The improved method advantageously implants a desired amount of dopants to form a desired implanted profile on a substrate surface, thereby providing an uniform doped ion concentration cross the substrate and forming electric devices on the substrate with desired electrical performance.

While the foregoing is directed to embodiments of the present invention, other and further embodiments of the invention may be devised without departing from the basic scope thereof, and the scope thereof is determined by the claims that follow.

What is claimed is:

1. A method for implanting material into a substrate by a plasma immersion ion implantation process, comprising:
    providing a substrate to a processing chamber, the substrate comprising a substrate surface having a material layer formed thereon;
    generating a first plasma of a non-dopant processing gas to produce non-dopant ions;
    implanting non-dopant ions into the material layer by exposing the material layer to the first plasma of the non-dopant processing gas;
    generating a second plasma of a reacting gas adapted to produce dopant ions;
    implanting dopant ions from the second plasma into the material layer, wherein the flow of the second plasma is interrupted one or more times during the implantation process; and
    flowing a cleaning gas into the processing chamber during an interruption of the flow of the second plasma.

2. The method of claim 1, wherein the non-dopant processing gas is selected from the group consisting of an inert gas, hydrogen gas, or combinations thereof.

3. The method of claim 2, wherein the inert gas is selected from the group consisting of helium, argon, and combinations thereof.

4. The method of claim 1, wherein implanting non-dopant ions into the material layer comprises modifying the material layer to provide a dopant profile of 2 nm/dec or less.

5. The method of claim 1, wherein the reacting gas comprises a gas selected from the group consisting of a boron-containing gas, an arsenic-containing gas, phosphorus-containing gases, and combinations thereof.

6. The method of claim 5, wherein the reacting gas comprises a gas selected from the group consisting of B$_2$H$_6$, AsH$_3$, PH$_3$, and combinations thereof.

7. The method of claim 1, further comprising:
    generating a third plasma of the non-dopant processing gas; and
    exposing the material layer to the third plasma of the non-dopant processing gas.

8. The method of claim 1, wherein the generating a first plasma of a non-dopant processing gas and the generating a second plasma of a dopant processing gas are performed in situ.

9. The method of claim 1, wherein the dopants have a dose from about 10$^{14}$ atoms/cm$^2$ to about 10$^{16}$ atoms/cm$^2$ at a depth of about 500 Å.

10. The method of claim 1, wherein the generating a first plasma of a non-dopant processing gas comprises applying a source power to a plasma source from 100 watts to 2,000 watts and a bias to a substrate support from 200 volts to 7,000 volts.

11. A method for implanting material into a substrate by a plasma immersion ion implantation process, comprising:
    providing a substrate to a processing chamber, the substrate comprising a substrate surface having a material layer formed thereon;
    generating a first plasma of a dopant processing gas including a reacting gas adapted to produce dopant ions;
    implanting dopant ions from the first plasma into the material layer, wherein the flow of the first plasma is interrupted one or more times during the implantation process;
    flowing a cleaning gas into the processing chamber during an interruption of the flow of the first plasma;
    generating a second plasma of a non-dopant processing gas; and
    exposing the material layer to the second plasma of the non-dopant processing gas.

12. The method of claim 11, wherein the non-dopant processing gas is selected from the group consisting of an inert gas, hydrogen gas, or combinations thereof.

13. The method of claim 12, wherein the inert gas is selected from the group consisting of helium, argon, and combinations thereof.

14. The method of claim 12, wherein the exposing the material layer to the second plasma of the non-dopant processing gas comprises modifying the material layer to provide a dopant profile of 2 nm/dec or less.

15. The method of claim 12, wherein the reacting gas comprises a gas selected from the group consisting of a boron-containing gas, an arsenic-containing gas, phosphorus-containing gases, and combinations thereof.

16. The method of claim 12, wherein the reacting gas comprises a gas selected from the group consisting of B$_2$H$_6$, AsH$_3$, PH$_3$, and combinations thereof.

17. The method of claim 11, wherein the generating a second plasma of a non-dopant processing gas and the generating a first plasma of a dopant processing gas are performed in situ.

18. The method of claim 11, wherein the dopants have a dose from about 10$^{14}$ atoms/cm$^2$ to about 10$^{16}$ atoms/cm$^2$ at a depth of about 500 Å.

19. The method of claim 11, wherein the generating a first plasma of a non-dopant processing gas comprises applying a source power to a plasma source from 100 watts to 2,000 watts and a bias to a substrate support from 200 volts to 7,000 volts.

20. The method of claim 11, further comprising performing a surface etch or chamber cleaning of the chamber following the implantation process.

* * * * *